(12) United States Patent
Takaishi

(10) Patent No.: US 6,753,868 B2
(45) Date of Patent: Jun. 22, 2004

(54) SINGLE-CHIP MICROCOMPUTER AND METHOD OF MODIFYING MEMORY CONTENTS OF ITS MEMORY DEVICE

(75) Inventor: Izumi Takaishi, Hyogo (JP)

(73) Assignees: Renesas Technology Corp., Tokyo (JP); Mitsubishi Electric System LSI Design Corporation, Itami (JP)

(*) Notice: Subject to any disclaimer, the term of this patent is extended or adjusted under 35 U.S.C. 154(b) by 345 days.

(21) Appl. No.: 09/829,999

(22) Filed: Apr. 11, 2001

(65) Prior Publication Data

US 2001/0048442 A1 Dec. 6, 2001

(30) Foreign Application Priority Data

Jun. 6, 2000 (JP) ........................................ 2000-169505

(51) Int. Cl.[7] .............................................. G06F 13/14
(52) U.S. Cl. ....................................... 345/519; 345/783
(58) Field of Search ................................. 345/501–506, 345/519–520, 522, 530–574, 783

(56) References Cited

U.S. PATENT DOCUMENTS

| | | | | |
|---|---|---|---|---|
| 4,688,032 A | * | 8/1987 | Saito et al. ................. | 345/565 |
| 5,611,041 A | * | 3/1997 | Bril et al. ................... | 345/558 |
| 5,774,189 A | * | 6/1998 | Ishii et al. .................. | 348/563 |
| 5,917,468 A | * | 6/1999 | Han ........................... | 345/581 |
| 6,094,698 A | * | 7/2000 | Namikawa .................... | 710/74 |
| 6,543,008 B1 | * | 4/2003 | Ninomiya ..................... | 714/42 |
| 6,557,170 B1 | * | 4/2003 | Wilder et al. ................ | 725/130 |
| 6,611,270 B1 | * | 8/2003 | Hosotani ...................... | 345/530 |

FOREIGN PATENT DOCUMENTS

JP          7-281952          10/1995

* cited by examiner

Primary Examiner—Matthew C. Bella
Assistant Examiner—Allen E Quillen
(74) Attorney, Agent, or Firm—Burns, Doane, Swecker & Mathis, L.L.P.

(57) ABSTRACT

A CPU including a CPU-side signal line for connecting each of CPU-side memory device, OSD device, and OSD-side memory device to the CPU, and switching means for disconnecting the OSD device and OSD-side memory device from the CPU-side signal line when the CPU erases or rewrites memory contents of the CPU-side memory device through the CPU-side signal line.

4 Claims, 2 Drawing Sheets

SINGLE-CHIP MICROCOMPUTER AND METHOD OF MODIFYING MEMORY CONTENTS OF ITS MEMORY DEVICE

BACKGROUND OF THE INVENTION

1. Field of the Invention

The present invention relates to a single-chip microcomputer incorporating an OSD (On Screen Display) device having an image display function, and particularly to a single-chip microcomputer which can perform erasing or rewriting operation of a memory device using a CPU separately from image display operation using an OSD device by disconnecting the OSD device from a signal line connecting it with the CPU, and a method of modifying memory contents of the memory device.

2. Description of the Prior Art

When erasing or rewriting memory contents of a memory circuit is carried out in a conventional single-chip microcomputer in which a CPU and memory circuits are formed on a single chip, the CPU erases or rewrites the memory contents of each memory circuit by controlling certain functions of the microcomputer. In case of audio visual (AV) apparatus including a television or liquid crystal display, images including characters are displayed using a microcomputer having an image display function (hereinafter, referred to as OSD function) on a cathode-ray tube (Braun tube) or a display of the liquid crystal display device.

FIG. 3 is a block diagram showing a construction of a conventional single-chip microcomputer including the memory circuits and having the OSD function as mentioned above. In the same drawing, reference numeral 31 designates a CPU for executing commands included in a CPU program, 32 denotes a signal line for connecting BOOT ROM 34, ROM 35, OSDROM 36, and OSD circuit 37 to CPU 31, respectively, via sequencer 33 and propagating signals (address signals, data signals) between CPU 31 and these devices. Signal line 32 is composed of address buses and data buses. Sequencer 33 is connected to CPU 31, ROM 35, and OSDROM 36 via signal line 32 and controls the order of applying voltages for erasing or rewriting to each of memory circuits which construct ROM 35 and OSDROM 36 when CPU 31 erases or rewrites memory contents of these memory devices.

BOOT ROM 34 stores each erasing or rewriting program which is read by CPU 31 selectively or properly to execute erasing or rewriting operation when CPU 31 erases or rewrites memory contents of ROM 35 or OSDROM 36. ROM 35 is a memory circuit which stores a CPU program (program relating to functions to be executed by the microcomputer) to be executed by CPU 31, and is composed of a non-volatile memory, for example, a flash memory whose memory contents are electrically erasable or rewritable. OSDROM 36 is a memory circuit which stores image display data to be used when OSD cirsuit 37 produces display signals, and is composed of a non-volatile memory, for example, a flash memory whose memory contents are electrically erasable or rewritable. OSD circuit 37 produces display signals relating to image information to be displayed on an external display device (not shown) based on commands from CPU 31, and outputs them to the display device. Signal line 38 is connected to OSDROM 36 and OSD circuit 37, and propagates image display data selected based on commands from CPU 31 and signals relating to their address data in OSDROM 36.

Next, operation of the above system is described. CPU 31 reads in succession commands included in a CPU program stored in ROM 35, and executes selectively a process relating to each function of the microcomputer by writing in ROM 35 the data produced through the process or by reading data stored in ROM 35

First, in operation of the image display function, a control section (not shown) in OSD circuit 37 is controlled by command execution by CPU 31 to operate OSD circuit 37.

When address data in OSDROM 36 and display positions on a display of an external display device (not shown) of image display data (information including graphics, character fonts and colors) relating to images (including character information) to be displayed on the external display device are set by CPU 31 via signal line 32, OSD circuit 37 outputs address signals corresponding to the address data to OSDROM 36 via signal line 38. When OSDROM 36 receives the address signals, it extracts image display data corresponding to the address data, and outputs them to OSD circuit 37 via signal line 38. OSD circuit 37 produces display signals relating to images (including character information) to be displayed on the external display device (not shown) using the image display data, and outputs them to the external display device via a signal line (not shown) to display images (including character information) relating to the display signals.

Next, rewriting operation of memory contents of the memory circuits (ROM 35, OSDROM 36) is described.

Since the rewriting operation of memory contents of ROM 35 or OSDROM 36 by CPU 31 is carried out in a generally similar manner, only the operation for rewriting program data written in ROM 35 to modify the CPU program is now described. CPU 31 reads an erasing or rewriting program for executing erasing or rewriting operation from BOOT ROM 34, and the contents of the CPU program are rewritten in accordance with the erasing or rewriting program. Specifically, CPU 31 applies voltages for erasing or rewriting operation, in succession, to memory cells of ROM 35 using sequencer 33 to erase or rewrite the memory contents of ROM 35.

In this case, since CPU 31, sequencer 33 and ROM 35 are connected with one another via signal line 32, CPU 31 can not set in OSD circuit 37 the address data in OSDROM 36 and display positions on a display of an external display device (not shown) of image display data relating to images to be displayed on the external display device until the rewriting operation of memory contents of ROM 35 by CPU 31 is completed. Additionally, OSD circuit 37 can not output or read address signals of the image display data in OSDROM 36 based on the setting by CPU 31 via signal line 32. Therefore, OSDROM 36 and OSD circuit 37 must be in a wait state until the rewrite operation of memory contents of ROM 35 by CPU 31 is completed.

On the other hand, when OSDROM 36 and OSD circuit 37 perform the image display operation as mentioned above, the rewriting operation of memory contents of ROM 35 by CPU 31 can not be carried out because output or reading of address signals of the image display data in OSDROM 36 is executed based on the setting by CPU 31 via signal line 32.

Since conventional single-chip microcomputers are constructed as described above, OSDROM 36 and OSD circuit 37 must be in a wait state until the rewriting operation of memory contents of ROM 35 by CPU 31 is finished, so that the image display function can not be operated during that wait state. On the other hand, the rewriting operation of memory contents of ROM 35 by CPU 31 can not be performed during the image display operation by OSDROM 36 and OSD circuit 37.

The present invention was made to solve the above problems, and it is an object of this invention to provide a single-chip microcomputer which can perform the erasing or rewriting operation of memory devices using the CPU separately from the image display operation using the OSD device by selectively disconnecting the OSD device from a signal line which connects the OSD device with the CPU.

Another object of the present invention is to provide a method of modifying memory contents of memory devices of a single-ship microcomputer which can perform the erasing or rewriting operation of the memory devices using the CPU separately from the image display operation using the OSD device.

SUMMARY OF THE INVENTION

A single-chip microcomputer according to the present invention includes a CPU for executing commands included in a CPU program, a CPU-side memory device whose memory contents are electrically erasable or rewritable and which stores a CPU program to be executed by the CPU, an OSD device which produces and outputs display signals relating to image information to be displayed on an external display device based on commands from the CPU to bring the external display device to display the image information, an OSD-side memory device whose memory contents are electrically erasable or rewritable and which stores image display data to be used when the OSD device produces display signals, a CPU-side signal line which connects each of the CPU-side memory device, OSD device, and OSD-side memory device to the CPU and propagates signals between the CPU and these devices, an OSD-side signal line which is connected to the OSD-side memory device and OSD device and propagates image display data selected based on commands from the CPU and signals relating to their address data in the OSD-side memory device, and switching means for disconnecting the OSD device and OSD-side memory device from the CPU-side signal line when the CPU erases or rewrites memory contents of the CPU-side memory device via the CPU-side signal line.

Another single-chip microcomputer according to the present invention includes a plurality of OSD-side memory devices and a plurality of OSD-side signal lines for connecting each OSD-side memory device with the OSD device, and the switching means switches each OSD-side memory device connected with the CPU selectively or properly so that the OSD device can use image display data stored in one of the plurality of OSD-side memory devices while the CPU can erase or rewrite image display data of the other OSD-side memory devices.

In a method of modifying memory contents of memory devices of a single-chip microcomputer according to the present invention, the single-chip microcomputer includes a CPU for executing commands included in a CPU program, a CPU-side memory device whose memory contents are electrically erasable or rewritable and which stores a CPU program to be executed by the CPU, an OSD device which produces and outputs display signals relating to image information to be displayed on an external display device based on commands from the CPU to bring the external display device to display the image information, an OSD-side memory device whose memory contents are electrically erasable or rewritable and which stores image display data to be used when the OSD device produces a display signal, a CPU-side signal line which connects each of the CPU-side memory device, OSD device, and OSD-side memory device to the CPU and propagates signals between the CPU and these devices, and an OSD-side signal line which is connected to the OSD-side memory device and OSD device and propagates image display data selected based on commands from the CPU and signals relating to their address data stored in the OSD-side memory device, and the method comprises the step of disconnecting the OSD device and OSD-side memory device from the CPU-side signal line when the CPU erases and rewrites memory contents of the CPU-side memory device via the CPU-side signal line In another method of modifying memory contents of memory devices of a single-chip microcomputer according to the present invention, the single-chip microcomputer includes a CPU for executing commands included in a CPU program, a CPU-side memory device whose memory contents are electrically erasable or rewritable and which stores a CPU program to be executed by the CPU, an OSD device which produces and outputs display signals relating to image information to be displayed on an external display device based on commands from the CPU to bring the external display device to display the image information, a plurality of OSD-side memory devices whose memory contents are electrically erasable or rewritable and which store image display data to be used when the OSD device produces display signals, a CPU-side signal line which connects each of the CPU-side memory device, OSD device, and OSD-side memory devices to the CPU and propagates signals between the CPU and these devices, and a plurality of OSD-side signal lines which are connected to each of the OSD-side memory devices and OSD device and propagate image display data selected based on commands from the CPU and signals relating to their address data stored in the OSD-side memory devices, and the method comprises the step of disconnecting the OSD device and each OSD-side memory device which stores image display data to be used by the OSD device from the CPU-side signal line when the CPU performs erasing or rewriting operation of memory contents of the CPU-side memory devices via the CPU-side signal line, and switching each OSD-side memory device connected with the CPU selectively or properly so that the OSD device can use image display data stored in one of the plurality of OSD-side memory devices while the CPU can erase or rewrite image display data of the other OSD-side memory devices.

DETAILED DESCRIPTION OF THE PREFERRED EMBODIMENTS

Embodiment 1

Figure 1:
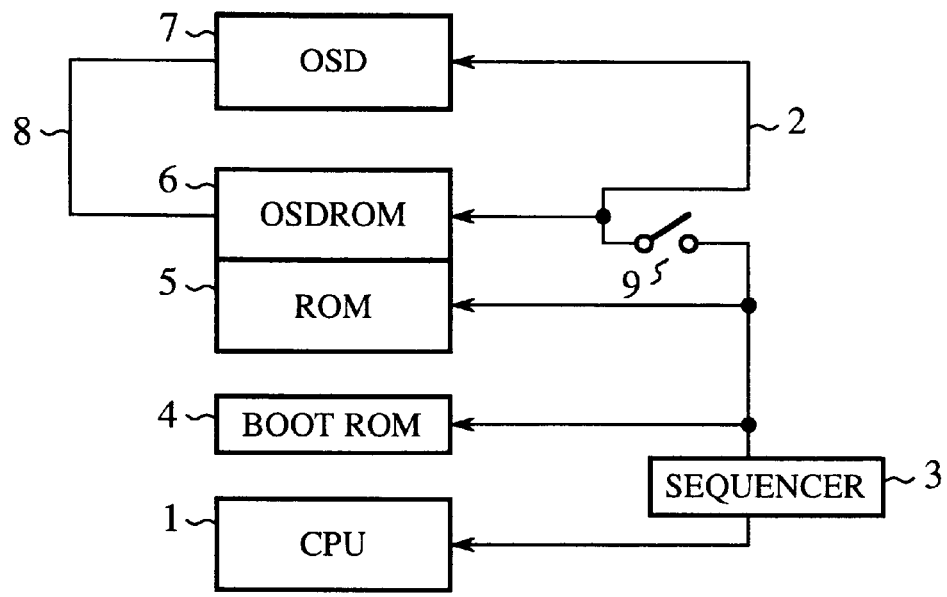
FIG. 1 is a block diagram showing a construction of a single-chip microcomputer according to Embodiment 1 of the present invention.

FIG. 1 is a block diagram showing a construction of a single-chip microcomputer according to Embodiment 1 of the present invention. In the same drawing, reference numeral 1 designates a CPU for executing commands included in a CPU program, 2 denotes a signal line (CPU-side signal line) for connecting each of BOOT ROM 4, ROM 5, OSDROM 6, and OSD circuit 7 to CPU 1 via sequencer 3 and propagating signals (address signals, data signals) between CPU 1 and these devices. Signal line 2 is composed of address buses and data buses. Sequencer 3 is connected to CPU 1, ROM 5, and OSDROM 6 via signal line 2 to control the order of applying voltages for erasing or rewriting to each of memory circuits which construct ROM 5 and OSDROM 6 when CPU 1 erases or rewrites memory contents of these memory devices.

BOOT ROM 4 stores each erasing or rewriting program which is read by CPU 1 selectively or properly to execute erasing or rewriting operation when CPU 1 erases or rewrites memory contents of ROM 5 or OSDROM 6. ROM 5 (CPU-side memory device) is a memory circuit which stores a CPU program (program relating to functions to be executed by the microcomputer) to be executed by CPU 1, and is composed of a non-volatile memory, for example, a flash memory whose memory contents are electrically erasable or rewritable. OSDROM 6 (OSD-side memory device) is a memory circuit which stores image display data to be used when OSD circuit 7 produces display signals, and is composed of a non-volatile memory, for example, a flash memory whose memory contents are electrically erasable or rewritable. OSD circuit 7 (OSD device) produces display signals relating to image information to be displayed on an external display device (not shown) based on commands from CPU 31, and outputs them to the display device. Signal line 8 (OSD-side signal line) is connected to OSDROM 6 and OSD circuit 7, and propagates image display data selected based on commands from CPU 31 and signals relating to their address data in OSDROM 6. In addition, switch 9 (switching means) is provided on signal line 2 to disconnect selectively or properly a portion of signal line 2 connecting with OSDROM 6 and OSD circuit 7 from a portion of signal line 2 connecting with the other components. The construction of switch 9 is achieved by combination of appropriate logic operation components in the microcomputer.

Next, operation of the above system is described. CPU 1 reads in succession commands included in a CPU program stored in ROM 5, and executes selectively a process relating to each function of the microcomputer by writing in ROM the data produced through the process or by reading data stored in ROM 5. To this step the system operates as described in the above conventional microcomputer.

First, in operation of the image display function, a control section (not shown) in OSD circuit 7 is controlled by command execution by CPU 1 to operate OSD circuit 7.

OSD circuit 7 sets address data in OSDROM 6 and display positions on a display of an external display device (not shown) for image display data (information including graphics, character fonts and colors) relating to images (including character information) to be displayed on the external display device by CPU 1 via signal line 2. At the time, switch 9 provided on signal line 2 is in a closed state to connect CPU 1 with OSDROM 6 and OSD circuit 7. When address data and display positions on a display relating to image display data are set based on commands from CPU 1, OSD circuit 7 outputs address signals corresponding to the address data to OSDROM 6 via signal line 8. When OSDROM 6 receives the address signals, it extracts image display data corresponding to the address data, and outputs them to OSD circuit 7 via signal line 8. OSD circuit 7 then produces display signals relating to images (including character information) to be displayed on an external display device (not shown) using the image display data, and outputs them to the external display device via a signal line (not shown) to display images (including character information) relating to the signals.

Next, rewriting operation of memory contents of ROM 5 by CPU 1 is described.

CPU 1 reads an erasing or rewriting program for executing erasing or rewriting operation from BOOT ROM 4, and the contents of the CPU program are rewritten in accordance with the erasing or rewriting program. Specifically, CPU 1 applies voltages for erasing or rewriting operation, in succession, to memory cells of ROM 5 using sequencer 3 to erase or rewrite the memory contents of ROM 5.

At the time, switch 9 is in a opened state to disconnect a portion where CPU 1, sequencer 3, and ROM 5 are connected with one another via signal line 2 from OSDROM 6 and OSD circuit 7. As the result, even if the rewriting operation of memory contents of ROM 5 by CPU 1 is carried out when the image display operation by OSDROM 6 and OSD circuit 7 as mentioned above is in progress, since OSDROM 6 and OSD circuit 7 are connected with each other via signal line 8, OSD circuit 7 can output or read address signals of image display data in OSDROM 6 based on the setting by CPU 1 via signal line 8. Therefore, the image display operation by OSDROM 6 and OSD circuit 7 can be continued while the rewriting operation of memory contents of ROM 5 by CPU 1 is performed.

Accordingly, when switch 9 is closed, both the setting of image display data by CPU 1 and the image display operation by OSDROM 6 and OSD circuit 7 are performed, and when switch 9 is opened, the rewriting operation of memory contents of ROM 5 by CPU 1 is carried out while the image display operation is continued by OSDROM 6 and OSD circuit 7 based on the image display data set by CPU 1 when switch 9 was closed.

Alternatively, the CPU program or the erasing or rewriting program may be set so that CPU 1 detects whether the image display operation by OSDROM 6 and OSD circuit 7 is in progress or not when CPU 1 begins the rewriting operation of ROM 5, and if the image display operation is performed by OSDROM 6 and OSD circuit 7, the setting of image display data by CPU 1 is carried out before the rewriting operation of memory contents of ROM 5.

In addition, the setting of image display data by CPU 1 may be performed selectively or properly by periodically switching switch 9 during the rewriting operation of memory contents of ROM 5 by CPU 1 so that the image display operation by OSDROM 6 and OSD circuit 7 can be continued during the rewriting operation.

As mentioned above, the microcomputer according to the present invention includes CPU 1 for executing commands included in a CPU program, ROM 5 whose memory contents are electrically erasable and rewritable and which stores a CPU program to be executed by CPU 1, OSD circuit 7 which produces and outputs display signals relating to image information to be displayed on an external display device based on commands from CPU 1 to bring the external display device to display the image information, OSDROM 6 whose memory contents are electrically erasable and rewritable and which stores image display data to be used when OSD circuit 7 produces display signals, signal line 2 which connects each of ROM 5, OSD circuit 7, and OSDROM 6 to CPU 1 and propagates signals between CPU 1 and these devices, signal line 8 which is connected to OSDROM 6 and OSD circuit 7 and propagates image display data selected based on commands from CPU 1 and signals relating to their address data in OSDROM 6, and switch 9 for disconnecting OSD circuit 7 and OSDROM 6 from signal line 2 when CPU 1 erases or rewrites memory contents of ROM 5 via signal line 2. Accordingly, since the erasing or rewriting operation of ROM 5 by CPU 1 can be performed separately from the image display operation by OSD circuit 7 and OSDROM 6, the inconvenience that one of these two operations must be in a wait state during the other operation can be avoided, thereby improving working efficiency.

Embodiment 2

This Embodiment 2 includes a plurality of OSD-side memory devices and a plurality of OSD-side signal lines for connecting each of the OSD-side memory devices to an OSD device, and the switching means switches each of the OSD-side memory devices connected with a CPU so that the OSD device can use image display data stored in one of the plurality of OSD-side memory devices while the CPU can erase or rewrite image display data of the other OSD-side memory devices.

Figure 2:
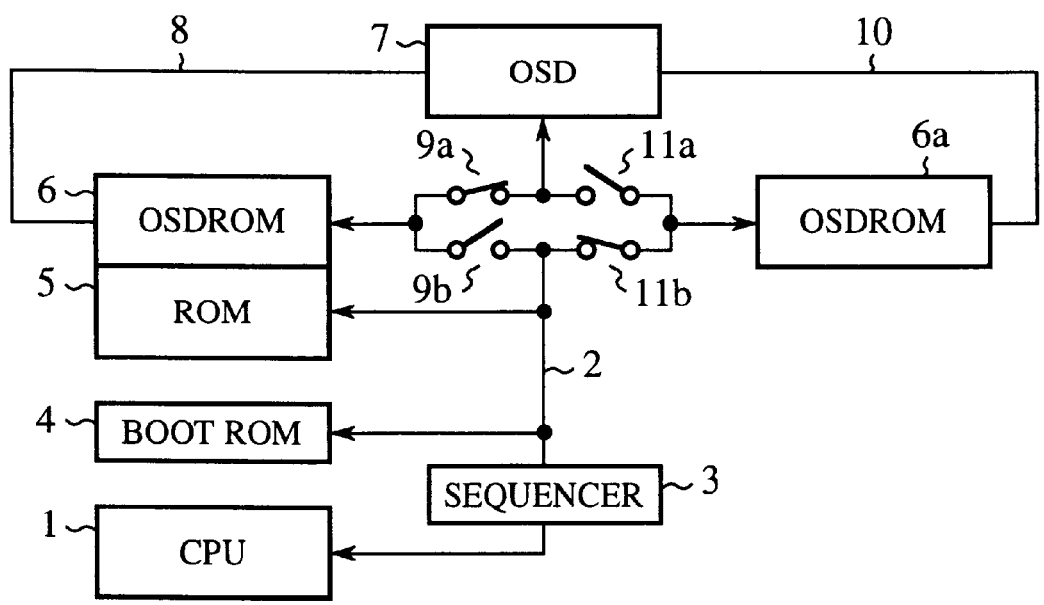
FIG. 2 is a block diagram showing a construction of a single-chip microcomputer according to Embodiment 2 of the present invention.
Figure 3:
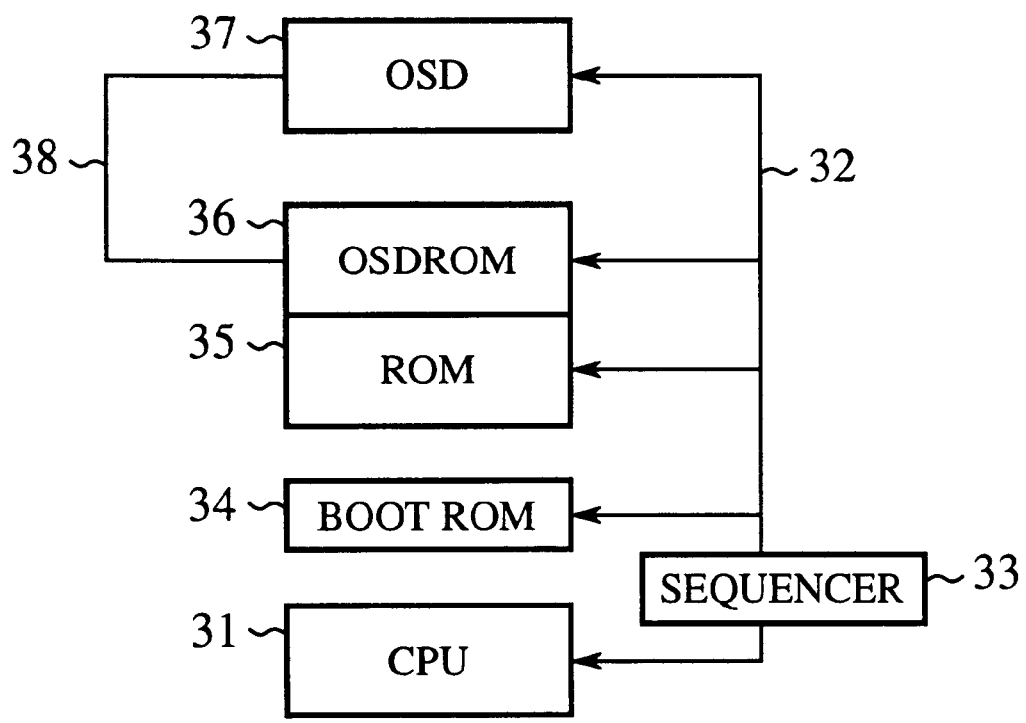
FIG. 3 is a block diagram showing a construction of a conventional single-chip microcomputer.

FIG. 2 is a block diagram showing a construction of a single-microcomputer according to Embodiment 2 of the present invention. In the drawing, reference numeral 6a designates an OSDROM (OSD-side memory device) which is a memory circuit for storing image display data to be used when OSD circuit 7 produces image signals, and is composed of a non-volatile memory, for example a flash memory, whose memory contents are electrically erasable and rewritable like OSDROM 6. Switch (switching means) 9a is provided on signal line 2 to open and close the connection between OSDROM 6 and OSD circuit 7, and switch (switching means) 9b is provided on signal line 2 to open and close the connection between OSDROM 6 and CPU 1. Signal line 10 connects OSDROM 6a with OSD circuit 7 to propagate image display data selected based on commands from CPU 1 and signals relating to their address data in OSDROM 6a. Switch (switching means) 11a is provided on signal line 2 to open and close the connection between OSDROM 6a and OSD circuit 7, and switch (switching means) 11b is provided on signal line 2 to open and close the connection between OSDROM 6a and CPU 1. The construction of each of the switches 9a, 9b, 11a, 11b is achieved by combination of appropriate logic operation components. In FIG. 2, like reference numerals are given to like components in FIG. 1, and the description on those like components is not repeated.

Next, operation of the above system is described. CPU 1 reads in succession commands included in a CPU program stored in ROM 5, and executes selectively a process relating to each function of the microcomputer by writing in ROM the data produced through the above process or by reading data stored in ROM 5. To this step this system operates as described in case of the microcomputer of Embodiment 1.

First, in operation of the image display function, a control section (not shown) in OSD circuit 7 is controlled by command execution by CPU 1 to operate OSD circuit 7.

By setting both switches 9a, 9b in a closed state, OSD circuit 7 sets address data in OSDROM 6 and display positions on a display of an external display device (not shown) for image display data (information including graphics, character fonts and colors) relating to images (including character information) to be displayed on the external display device based on commands from CPU 1 via signal line 2. When the address data and display positions on a display relating to image display data are set based on the commands from CPU 1, OSD circuit 7 outputs address signals corresponding to the address data to OSDROM 6 through signal line 8. After receiving the address signals, OSDROM 6 extracts image display data corresponding to the address data and outputs them to OSD circuit 7 through signal line 8. OSD circuit 7 then uses the image display data to produce display signals relating to images (including character information) to be displayed on an external display device (not shown), and outputs the signals to the external display device via a signal line (not shown), thereby displaying images (including character information) relating to the signals.

At the time, switch 9b is opened to disconnect a portion where CPU 1, sequencer 3, and ROM 5 are connected with one another via signal line 2 from OSDROM 6 and OSD circuit 7. As the result, even if the rewriting operation of memory contents of ROM 5 by CPU 1 is carried out as described in the case of Embodiment 1 during the image display operation of OSDROM 6 and OSD circuit 7 as mentioned above, OSD circuit 7 can perform the output or reading operation of address signals of image display data in OSDROM 6 based on the setting by CPU 1 since OSDROM 6 and OSD circuit 7 are connected with each other via signal line 8. Thus, OSDROM 6 and OSD circuit 7 can continue the image display operation during the rewriting operation of memory contents of ROM 5 by CPU 1.

Accordingly, when both switches 9a, 9b are in a closed state, the setting operation of image display data by CPU 1 and the image display operation by OSDROM 6 and OSD circuit 7 can be performed. When switch 9a is closed and switch 9b is opened, the rewriting operation of memory contents of ROM 5 by CPU 1 can be carried out along with the image display operation by OSDROM 6 and OSD circuit 7 based on the image display data set by CPU 1 when both switches 9a, 9b were in a closed state.

Likewise, in case of OSDROM 6a and OSD circuit 7, when both switches 11a, 11b are in a closed state, the setting operation of image display data by CPU 1 and the image display operation by OSDROM 6a and OSD circuit 7 can be performed. When switch 11a is closed and switch 11b is opened, the rewriting operation of memory contents of ROM 5 by CPU 1 can be carried out along with the image display operation by OSDROM 6a and OSD circuit 7 based on the image display data set by CPU 1 when both switches 11a, 11b were in a closed state.

Next, rewriting operation of memory contents of OSDROMs 6, 6a by CPU 1 is described.

When switch 9a is closed, switch 9b is opened, switch 11a is opened, and switch 11b is closed, a portion where CPU 1, sequencer 3, and OSDROM 6a are connected with one another via signal line 2 can be disconnected from OSDROM 6 and OSD circuit 7 so that the rewriting operation of memory contents of OSDROM 6a by CPU 1 can be performed during the image display operation by OSDROM 6 and OSD circuit 7. As in the case of ROM 5, CPU 1 reads an erasing or rewriting program for performing the erasing or rewriting operation from BOOT ROM 4, and the image display data, the contents of OSDROM 6a, are rewritten in accordance with the erasing or rewriting program. Specifically, CPU 1 applies voltages for erasing or rewriting operation in succession to memory cells of OSDROM 6a using sequencer 3 to erase or rewrite the memory contents of OSDROM 6a.

Alternatively, when switch 9a is opened, switch 9b is closed, switch 11a is closed, and switch 11b is opened, a portion where CPU 1, sequencer 3, and OSDROM 6 are connected with one another via signal line 2 can be disconnected from OSDROM 6a and OSD circuit 7 so that the rewriting operation of memory contents of OSDROM 6 by CPU 1 can be performed during the image display operation by OSDROM 6a and OSD circuit 7.

Accordingly, the single-chip microcomputer according to Embodiment 2 can modify the image display data of OSDROM 6a (or OSDROM 6) during the image display operation by OSDROM 6 (or OSDROM 6a) and OSD circuit 7 by switching switches 9a, 9b, 11a, 11b selectively or properly.

Alternatively, the CPU program or the erasing or rewriting program may be set so that CPU 1 detects whether the image display operation by OSDROM 6 (or OSDROM 6a) and OSD circuit 7 is in progress or not when CPU 1 begins the rewriting operation of ROM 5, and if the image display operation is performed by OSDROM 6 (or OSDROM 6a) and OSD circuit 7, the setting of image display data by CPU 1 is carried out before the rewriting operation of memory contents of ROM 5.

In addition, the setting of image display data by CPU 1 may be performed selectively or properly by periodically switching switches 9a, 9b, 11a, 11b during the rewriting operation of memory contents of ROM 5 by CPU 1 so that the image display operation by OSDROM 6 (or OSDROM 6a) and OSD circuit 7 can be continued during the rewriting operation.

Further, the setting of image display data by CPU 1 may be performed selectively or properly by periodically switching switches 9a, 9b, 11a, 11b so that the rewriting operation of image display data of OSDROM 6 (or OSDROM 6a) can be performed while the image display operation by OSDROM 6a (OSDROM 6) and OSD circuit 7 can be continued.

Though one example provided with two memory circuits, OSDROM 6 and OSDROM 6a, as the plurality of memory circuits for storing image display data was described in the above Embodiment 2, the present invention is not limited to this type of microcomputers, and it can be applied to the construction including three or more memory circuits for storing image display data based on the same concept as mentioned above.

As described above, the system according to Embodiment 2 is provided with the plurality of memory circuits OSDROMs 6, 6a and the plurality of signal lines 8, 10 for connecting these OSDROMs 6, 6a with OSD circuit 7, and switches 9a, 9b, 11a, 11b switch selectively or properly OSDROM 6 (or OSDROM 6a) connected with CPU 1 so that the OSD circuit 7 can use image display data stored in one of the plurality of OSDROMs 6, 6a while the CPU 1 can erase or rewrite image display data of the other OSDROM 6 (or OSDROM 6a). Therefore, in addition to the same effect as the above Embodiment 1, the image display data of OSDROM 6 (or OSDROM 6a) can be modified during the image display operation by OSDROM 6 (or OSDROM 6a) and OSD circuit 7, thereby improving efficiency of the image display function.

As mentioned above, one embodiment according to the present invention includes a CPU for executing commands included in a CPU program, a CPU-side memory device whose memory contents are electrically erasable and rewritable and which stores a CPU program to be executed by the CPU, an OSD device which produces and outputs display signals relating to image information to be displayed on an external display device based on commands from the CPU to bring the external display device to display the image information, an OSD-side memory device whose memory contents are electrically erasable and rewritable and which stores image display data to be used when the OSD device produces display signals, an CPU-side signal line which connects each of the CPU-side memory device, OSD device, and OSD-side memory device to the CPU and propagates signals between CPU 1 and these devices, an OSD-side signal line which is connected to the OSD-side memory device and OSD device and propagates image display data selected based on commands from the CPU and signals relating to address data stored in the OSD-side memory device, and a switch for disconnecting the OSD device and OSD-side memory device from the CPU-side signal line when the CPU erases or rewrites memory contents of the CPU-side memory device via the CPU signal line. Accordingly, since the erasing or rewriting operation of the CPU-side memory device by the CPU can be performed separately from the image display operation by the OSD device and OSD-side memory device, the inconvenience that one of these two operations must be in a wait state during the other operation can be avoided, thereby improving efficiency of the use.

Another embodiment according to the present invention includes a plurality of OSD-side memory devices and a plurality of OSD-side signal lines for connecting each OSD-side memory device with an OSD device, and the switching means switches selectively or properly each OSD-side memory device connected with a CPU device so that the OSD device can use image display data stored in one of the plurality of OSD-side memory devices while the CPU can erase or rewrite image display data of the other OSD-side memory devices. Therefore, in addition to the same effect as the above embodiment, the image display data of one OSD-side memory device can be modified during the image display operation by the other OSD-side memory devices and OSD device, thereby improving efficiency of the image display function.

In a method of modifying memory contents of memory devices of a single-chip microcomputer including a CPU for executing commands included in a CPU program, a CPU-side memory device whose memory contents are electrically erasable or rewritable and which stores a CPU program to be executed by the CPU, an OSD device which produces and outputs display signals relating to image information to be displayed on an external display device based on commands from the CPU to bring the external display device to display the image information, an OSD-side memory device whose memory contents are electrically erasable or rewritable and which stores image display data to be used when the OSD device produces a display signal, a CPU-side signal line which connects each of the CPU-side memory device, OSD device, and OSD-side memory device to the CPU and propagates signals between the CPU and these devices, and an OSD-side signal line which is connected to the OSD-side memory device and OSD device and propagates image display data selected based on commands from the CPU and signals relating to their address data stored in the OSD-side memory device, the method comprises the step of disconnecting the OSD device and OSD-side memory device from the CPU-side signal line when the CPU erases or rewrites memory contents of the CPU-side memory device via the CPU-side signal line so that the erasing or rewriting operation of the CPU-side memory device by the CPU can be performed separately from the image display operation by the OSD device and OSD-side memory device. Accordingly, this method can avoid inconvenience that one of the above two operations must be in a wait state during the other operation, thereby to improve efficiency for the use.

In another method of modifying memory contents of memory devices of a single-chip microcomputer including a CPU for executing commands included in a CPU program, a CPU-side memory device whose memory contents are electrically erasable or rewritable and which stores a CPU program to be executed by the CPU, an OSD device which produces and outputs display signals relating to image information to be displayed on an external display device based on commands from the CPU to bring the external display device to display the image information, a plurality of OSD-side memory device whose memory contents are electrically erasable or rewritable and which store image display data to be used when the OSD device produces display signals, a CPU-side signal line which connects each of the CPU-side memory device, OSD device, and OSD-side memory devices to the CPU and propagates signals between the CPU and these devices, and a plurality of OSD-side signal lines which are connected to each of the plurality of OSD-side memory devices and OSD device and propagate image display data selected based on commands from the CPU and signals relating to their address data in the OSD-side memory devices, the method comprises the step of disconnecting the OSD device and each OSD-side memory device which stores image display data to be used by the OSD device from the CPU-side signal line when the CPU erases or rewrites memory contents of the CPU-side memory device via the CPU-side signal line, and switching each of the OSD-side memory devices connected with the CPU so that the OSD device can use image display data stored in one of the plurality of OSD-side memory devices while the CPU can erase or rewrite image display data of the other OSD-side memory devices. Accordingly, this method provides the same effect as the method described above as well as an effect of improving efficiency of the image display function because the image display operation by one of the OSD-side memory devices and OSD device can be performed during the modifying operation of image display data of the other OSD-side memory devices.

What is claimed is:

1. A single-chip microcomputer comprising:
    a CPU for executing commands included in a CPU program,
    a CPU-side memory device whose memory contents are electrically erasable or rewritable and which stores a CPU program to be executed by the CPU,
    an OSD device which produces and outputs display signals relating to image information to be displayed on an external display device based on commands from the CPU to bring the external display device to display the image information,
    an OSD-side memory device whose memory contents are electrically erasable or rewritable and which stores image display data to be used when the OSD device produces the display signals,
    a CPU-side signal line which connects each of the CPU-side memory device, OSD device, and OSD-side memory device to the CPU and propagates signals between the CPU and these devices,
    an OSD-side signal line which is connected to the OSD-side memory device and OSD device and propagates image display data selected based on commands from the CPU and signals relating to their address data in the OSD-side memory device, and
    switching means for disconnecting the OSD device and OSD-side memory device from the CPU-side signal line when the CPU performs erasing or rewriting operation of memory contents of the CPU-side memory device via the CPU-side signal line.

2. The single-chip microcomputer according to claim 1, comprising a plurality of OSD-side memory devices and a plurality of OSD-side signal lines connecting each of the OSD-side memory devices with the OSD device, and the switching means for switching each OSD-side memory device connected with the CPU selectively so that the CPU device can use image display data stored in one of the plurality of OSD-side memory devices while the CPU can erase or rewrite image display data of the other OSD-side memory device.

3. In a method of modifying memory contents of memory devices of a single-chip microcomputer including a CPU having a means for executing commands included in a CPU program, a CPU-side memory device whose memory contents are electrically erasable or rewritable and which stores a CPU program to be executed by the CPU, an OSD device which produces and outputs display signals relating to image information to be displayed on an external display device based on commands from the CPU to bring the external display device to display the image information, an OSD-side memory device whose memory contents are electrically erasable or rewritable and which stores image display data to be used when the OSD device produces the display signals, a CPU-side signal line which connects each of the CPU-side memory device, OSD device, and OSD-side memory device to the CPU and propagates signals between the CPU and these devices, and an OSD-side signal line which is connected to the OSD-side memory device and OSD device and propagates image display data selected based on commands from the CPU and signals relating to their address data stored in the OSD-side memory device, and switching means for disconnecting the OSD device and the OSD-side memory device from the CPU-side signal line when the CPU performs erasing or rewriting operation of memory contents of the CPU-side memory device via the CPU-side signal line, the method comprising the step of:
    disconnecting the OSD device and OSD-side memory device from the CPU-side signal line by the switching means when the CPU erases and rewrites memory contents of the CPU-side memory device via the CPU-side signal line.

4. In a method of modifying memory contents of memory devices of a single-chip microcomputer including a CPU having a means for executing commands included in a CPU program, a CPU-side memory device whose memory contents are electrically erasable or rewritable and which stores a CPU program to be executed by the CPU, an OSD device which produces and outputs display signals relating to image information to be displayed on an external display device based on commands from the CPU to bring the external display device to display the image information, a plurality of OSD-side memory devices whose memory contents are electrically erasable or rewritable and which store image display data to be used when the OSD device produces the display signals, a CPU-side signal line which connects each of the CPU-side memory device, OSD device, and OSD-side memory devices to the CPU and propagates signals between the CPU and these devices, and a plurality of OSD-side signal lines which are connected to each of the OSD-side memory devices and OSD device and propagate image display data selected based on commands from the CPU and signals relating to their address data stored in the OSD-side memory devices, and switching means for disconnecting the OSD device and the OSD-side memory device from the CPU-side signal line when the CPU performs erasing or rewriting operation of memory contents of the CPU-side memory device via the CPU-side signal line, and for switching each OSD-side memory device connected with the CPU selectively so that the CPU device can use image display data stored in one of the plurality of OSD-side memory devices while the CPU can erase or rewrite image display data of the other OSD-side memory device, the method comprising the step of:
    disconnecting the OSD device and each OSD-side memory device which stores image display data to be used by the OSD device from the CPU-side signal line by the switching means when the CPU erases or rewrites memory contents of the CPU-side memory devices via the CPU-side signal line, and switching each OSD-side memory device connected with the CPU selectively by the switching means so that the OSD device can use image display data stored in one of the plurality of OSD-side memory devices while the CPU can erase or rewrite image display data of the other OSD-side memory devices.

* * * * *